United States Patent [19]

Hirano et al.

[11] E Patent Number: Re. 33,692

[45] Reissued Date of Patent: Sep. 17, 1991

[54] FAULT DIAGNOSIS SYSTEM FOR ELECTRONIC DEVICE ON AUTOMOBILES

[75] Inventors: Shigeaki Hirano; Hirotoshi Maekawa, both of Himeji, Japan

[73] Assignee: Mitsubishi Denki Kabushiki Kaisha, Japan

[21] Appl. No.: 608,734

[22] Filed: Nov. 5, 1990

Related U.S. Patent Documents

Reissue of:

[64] Patent No.: 4,901,025
Issued: Feb. 13, 1990
Appl. No.: 84,841
Filed: Aug. 13, 1987

[30] Foreign Application Priority Data

Aug. 18, 1986 [JP] Japan ..... 61-193120

[51] Int. Cl.[5] ..... G01R 31/00
[52] U.S. Cl. ..... 324/537; 324/384
[58] Field of Search ..... 324/500, 503, 537, 384, 324/731, 402; 364/431.01, 431.11, 550, 580; 340/459; 73/1 R, 158

[56] References Cited

U.S. PATENT DOCUMENTS

| | | | |
|---|---|---|---|
| 3,617,870 | 11/1971 | Howes | 324/73 R |
| 3,890,836 | 6/1975 | McKenzie et al. | 324/73 R |
| 4,168,527 | 9/1979 | Winkler | 324/73 R |
| 4,701,867 | 10/1987 | Brüggemann | 324/73 AT |

*Primary Examiner*—Kenneth A. Wieder
*Assistant Examiner*—Jack B. Harvey
*Attorney, Agent, or Firm*—Leydig, Voit & Mayer

[57] ABSTRACT

A fault diagnosis system is provided for vehicles having a pluarlity of automotive electronic devices which output fault diagnoses according to one of a plurality of output signal schemes disposed thereon. A vehicle-side connector includes pins for carrying signal lines for signals representing the results of the fault diagnoses output from the plurality of of electronic devices. The vehicle-side connector also includes at least one pin for carrying at least one control line for a signal designating a selected output signaling scheme to the electronic devices. One of a plurality of testers displays the results of the fault diagnoses on the basis of the signals transmitted from the respective electronic devices. Each tester has a tester-side connector which connects to the vehicle-side connector to connect the output signals from each of the electronic devices and the control signal for designating the selective signaling scheme.

2 Claims, 2 Drawing Sheets

FAULT DIAGNOSIS SYSTEM FOR ELECTRONIC DEVICE ON AUTOMOBILES

Matter enclosed in heavy brackets [ ] appears in the original patent but forms no part of this reissue specification; matter printed in italics indicates the additions made by reissue.

BACKGROUND OF THE INVENTION

1. Field of the Invention

The present invention relates to a fault diagnosis system which permits easy fault diagnosis of various automotive electronic devices.

Hitherto, fault diagnoses of electronic devices on automobiles have been conducted by connecting those devices to a tester via a pair of corresponding connectors which include a vehicle-side connector and a tester-side connector. The vehicle-side connector has a predetermined number of pins corresponding to the number of electronic devices and is connected to the electronic devices by a corresponding set of signal lines for transmitting therebetween signals representing the results of fault diagnosis of corresponding electronic devices and controlling signals from the tester. The tester-side connector also has a corresponding number of pins and is connected to the tester by another set of signal lines for transmitting therebetween the control signals from the tester and signals from the vehicle-side connector for display.

Consequently, if the number of electronic devices mounted in the automobile increases, the number of pins of both connectors must correspondingly be increased to accomodate the additional signal lines.

In addition, when the system of an electronic device has undergone a change, signals from the connector also undergo change, so that it sometimes becomes necessary to change the number of pins of the connectors and as well as alter the connections of the tester-side connector pins on each such occasion.

As a result, from a long-term perspective, compatible testers which ideally could be used for a wide variety of eleectronic fault diagnosis systems have not been available. Hence, it has been necessary to develop a special tester each time the fault diagnosis system changes. Accordingly there have been many wasteful factors such as different testers being prepared for different vehicle types and yearly model changes.

Next, a description will be made of a conventional fault diagnosis tester. FIG. 1 is a block diagram illustrating the configuration of a conventional fault diagnosis system. In FIG. 1, respective signal lines 9, 10, 11 and 12 are connected to a vehicle-side connector 5 from electronic devices 1, 2, 3, 4 which are control units for controlling various types of systems mounted on an automobile. In order to connect ON-OFF signals from the electronic devices 1, 2, 3 and 4 to a tester 7, a tester-side connector 6 which is connected to the tester 7 through signal lines 14, 15, 16 and 17 is connected to the vehicle-side connector 5. If a fault has occurred in any of the electronic devices 1 to 4, the result is diagnosed by the tester 7, and a code is displayed on a diplay 8 on the tester 7.

With the conventional fault diagnosis system, the electronic devices 1–4 are connected to each other as shown in FIG. 1. Thus, in cases where the number of systems is increased or a signaling system undergoes a change, it is necessary to change the number of pins at the vehicle-side connector 5 and the tester-side connector 6 for each such occasion. In addition, it is necessary to change the signal processing method of the tester 7 with respect to each terminal. Therefore, there have been drawbacks in that the testers become more specialized, pins must be rearranged or newly added, and that installation costs tend to become higher.

SUMMARY OF THE INVENTION

Accordingly, an object of the present invention is to provide a fault diagnosis system for automotive electronic devices which accommodates changes in the signaling system, allows the components of the system to be consolidated or added to, allows conventional-type testers to be used without modification, and also allows new types of testers to use the same connector, thereby overcoming the above-described drawbacks of the prior art.

In keeping with this aspect of the present invention, there is provided a fault diagnosis system for comprising a plurality of electronic devices mounted on the automobiles having corresponding signal lines and outputting the results of their fault diagnosis according to an output signaling schemes, at least one control line connected to the electronic devices and transmitting a signal selecting the output signal scheme, a vehicle-side connector connected to the signal lines and the control line, and a plurality of testers adapted to designate the output signaling scheme and to display results of fault diagnosis transmitted from the respective electronic devices in accordance with the designated output signaling scheme, each of the testers having a tester-side connector to be selectively connected to the vehicle-side connector for linking the signal lines and the control line between the electronic devices and the testers. In a preferred embodiment of the invention, signals representing the results of the fault diagnosis output from electronic devices on automobiles are converted from ON-OFF signals into serial signals by short-circuiting the control signal line to a grounding line inside the tester.

The above and other objects, features and advantages of the present invention will become clear from the following description of the preferred embodiment when the same is read in conjunction with the accompanying drawings.

DESCRIPTION OF THE PREFERRED EMBODIMENT

Figure 2:
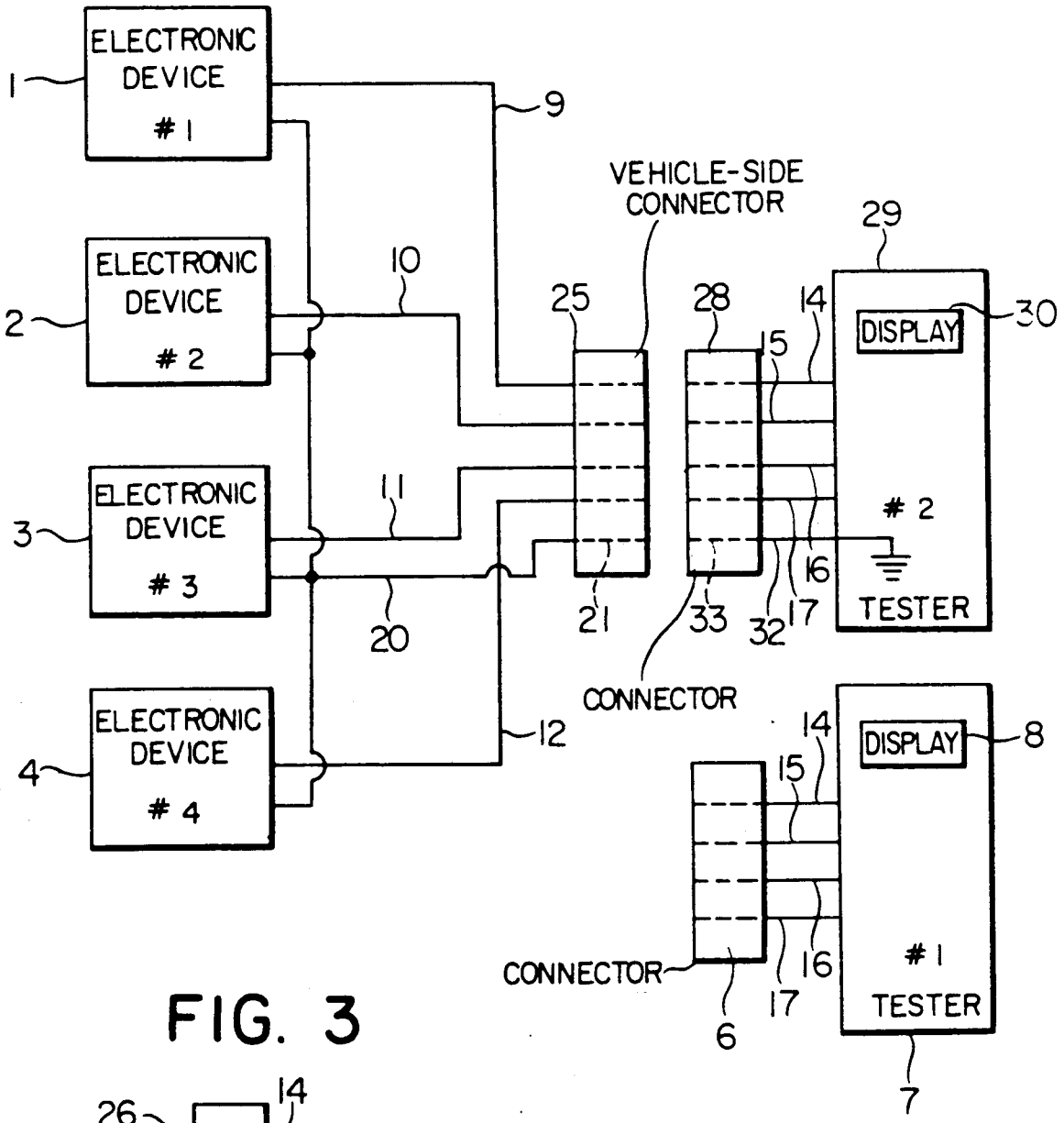
FIG. 2 is a block diagram illustrating the configuration of an embodiment of a fault diagnosis system for automotive electronic devices in accordance with the present invention.

Referring now to the accompanying drawings, description will be made of an embodiment of a fault diagnosis system for automotive electronic devices according to the present invention. FIG. 2 is a block diagram illustrating the configuration thereof. In this drawing, electronic devices 1–4, such as control units, are mounted on a vehicle are respectively connected through the signal lines 9–12 to a vehicle-side fault diagnosis connector 25, in which signals representing the results of fault diagnosis are collected from the electronic devices 1–4. The electronic devices 1–4 to be diagnosed themselves may be of a conventional design and are capable of outputting either ON-OFF signals or serial signals which have a higher speed than the ON-OFF signals. Many conventional automotive electronic devices generally have had function for outputting not only ON-OFF signals but also serial signals. Each of the electronic devices 1–4 is connected to the vehicle-side diagnosis connector 25 through a common control line 20 and through the respective signal lines 9–12. The control line 20 is connected to a connecting pin 21 mounted in the connector 25.

Figure 1:
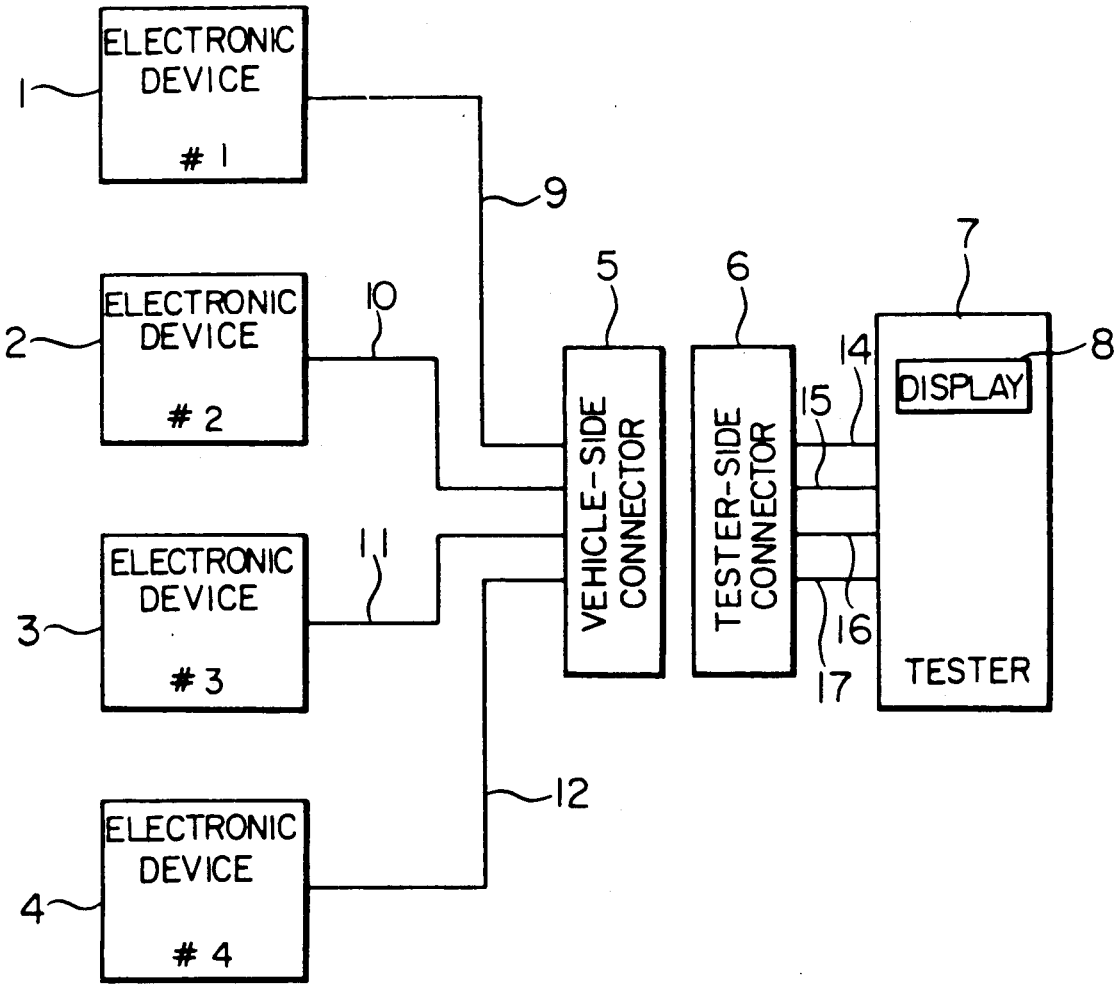
FIG. 1 PRIOR ART
FIG. 1 is a block diagram of a conventional fault diagnostic tester.

According to the illustrated embodiment of the fault diagnosis system of the present invention, either one of two kinds of testers 7 and 29 can be utilized. The tester 7 which is identical to that shown in FIG. 1 judges and displays the results of fault diagnosis by means of the ON-OFF signals just in the same manner as in the system shown in FIG. 1. The tester 29 displays the results of fault diagnosis by means of serial signals having a higher speed that that of ON-OFF signals. The tester 29 therefore is provided with a connector 28 having a connecting pin 33 to which a grounded line 32 is connected. The other end of the grounded line 32 is grounded within the tester 29. The tester 29 is provided with a display 30 for displaying the results of the diagnosis through the use of the serial signals. The tester 29 is also provided with signal lines 14–17 for connection to the connector 28 which is connectable to the vehicle-side connector 25.

When the tester 7 is connected to the electronic devices 1–4 through the connector 6 and the connector 25, all the signal lines 9–12 and 14–17 are connected respectively, but the control line 20 remains unconnected and the voltage of the control line 20 floats to a floating voltage. Therefore, the electronic devices 1–4 provide normal ON-OFF signals to the tester 7 through the signal lines 9–12, the connectors 25 and 28, and the signal lines 14–17.

When the tester 29 is connected to the electronic devices 1–4 through the connectors 28 and 25, the grounded line 32 and the control line 20 are connected together in addition to the signal lines 9–12 and 14–17. Therefore, control line 20 becomes grounded and each of the electronic devices 1–4 detect this. In response, each of the electronic devices 1–4 changes its signal supplying mode to provide serial signals rather than ON-OFF signals.

Next, description will be made of operation in accordance with the present invention. The results of fault diagnosis are normally output from the electronic devices 1–4 to the vehicle-side fault diagnosis connector 25. Consequently, the conventional-type tester 7 receives these results of fault diagnosis via the connector 6 and displays diagnosed faults on the display 31.

Figure 3:
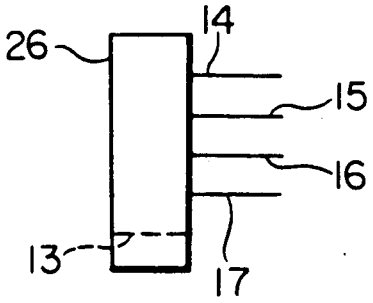
FIG. 3 is a schematic view showing another embodiment of the connector.

The control line 20 which directs the electronic devices to provide either ON-OFF signals or serial signals may be connected to the piston 13 of the terminal of the connector 6 as shown in FIG. 3. The pin at the position 13 is made a spare pin, and does not lead to the tester 7, so that signals from the electronic devices 1–4 permit fault diagnosis using a conventional-type tester. In addition, there is an advantage in that, if the pin at the position 13 is made a spare pin or is set in a non-connected state, fault diagnosis can be carried out by measuring each terminal of the vehicle-side fault diagnosis connector 25 using an ordinary voltmeter even if the tester 7 is not connected.

Description will now be given of cases where fault diagnosis is effected using serial signals, i.e., where the tester 29 for effecting diagnosis by means of serial signals is connected to the vehicle-side fault diagnosis connector 25. The control line 20 for changing over ON-OFF signals to serial signals is connected to the serial signal-use tester 29 via a line 32 running from the connector 28 to the tester 29 as seen in FIG. 2. When the vehicle-side fault diagnosis connector 25 and the connector 28 are connected, the line 32 is short-circuited to a grounding line inside the tester 29 so as to change the voltage level of the control line 20. Hence, the signal generating mode of the electronic devices 1–4 are shifted from the ON-OFF signal mode into the serial signal mode.

In other words, by changing the voltage level of one pin of the connector, i.e., the voltage level of the pin to which the control line 20 is connected, distinction between the conventional-type tester 7 and the serial signal-use tester 29 can be determined by the respective electronic devices. In response, the devices 1–4 change over the type of signal used for fault diagnosis.

When the conventional-type tester 7 is used, if the pin connected to the control line 20 remains unconnected, i.e. does not have a corresponding pin in the connector 6 so that there is no connection thereof to the tester 7, it is possible to read ON-OFF signals even when the connector 6 is fitted with the tester 7, thereby allowing the function of the conventional-type tester 7 to be domonstrated.

In the above, description has been made of an automobile fault diagnosis system which is capable of effecting transmission of two or more modes by changing the system of signals issued from electronic devices by causing changes in the voltage level of a specific terminal. As for the contents of signals, description has been made of transmitting ON-OFF and serial signals, but, by increasing the number of specific pins to two or more, it is possible to switch over a multiplicity of signaling systems more numerous than in the above-described case, thereby effecting a wider range of changeover.

As has been described, the fault diagnosis system in accordance with the present invention for automotive electronic devices, in which a common connector is installed at similar places or positions for each vehicle and signals from this connector are used, makes it possible to receive an ON-OFF signal in a state in which a connector of a diagnosis tester is not inserted into a vehicle-side fault diagnosis connector as well as making it possible to receive the contents of the totally different serial signal appearing at the vehicle-side fault diagnosis connector when the connector of the diagnosis tester is inserted even when the pins are the same. Therefore, even when the electronic devices are identical, two or more kinds of testers can be used, so that development of specialized use testers is no longer required. In addition, conventional testers can also be used via the same connector, and the costs required for testers in general can be reduced.

What is claimed is:

1. A fault diagnosis system for an automobile comprising:

at least one automotive electronic device mounted on an automobile which performs a fault diagnosis on the automobile, the electronic device having a signal line for outputting signals representing results of the fault diagnosis according to either one of a plurality of output signaling schemes and having a control line for inputting a signal selecting the output signal scheme;

a vehicle-side connector connected to the signal line and the control line;

a first tester adapted to a first one of the plurality of output signaling schemes and having a display for displaying results of the fault diagnosis transmitted from said electronic device in accordance with the first output signaling scheme, the first tester having a first tester-side connector which can be connected to said vehicle-side connector for linking the signal [lines] *line* and the control line between said electronic device and said first tester, the first tester providing a first signal for designating the first output signaling scheme to said control line; and a second tester adapted to a second one of the plurality of output signaling schemes and having a display for displaying results of the fault diagnosis transmitted from said electronic device in accordance with the second output signaling scheme, the second tester having a second tester-side connector which can be connected to said vehicle-side connector for linking the signal [lines] *line* and the control line between said electronic device and said second tester, the second tester providing a second signal for designating the second output signaling scheme to said control line;

wherein either one of said tester-side connectors of said testers can be selectively connected to said vehicle-side connector.

2. A fault diagnosis system according to claim 1 wherein:

the first tester is wired to provide a floating voltage over the control line, and the second tester is wired to connect the control line to a grounding point.

* * * * *